(12) United States Patent
Fujiwara et al.

(10) Patent No.: US 8,404,043 B2
(45) Date of Patent: Mar. 26, 2013

(54) PROCESS FOR PRODUCING POLYCRYSTALLINE BULK SEMICONDUCTOR

(75) Inventors: Kozo Fujiwara, Miyagi (JP); Kazuo Nakajima, Miyagi (JP)

(73) Assignee: Tohoku University (JP)

( * ) Notice: Subject to any disclaimer, the term of this patent is extended or adjusted under 35 U.S.C. 154(b) by 1335 days.

(21) Appl. No.: 12/130,863

(22) Filed: May 30, 2008

(65) Prior Publication Data

US 2009/0000536 A1    Jan. 1, 2009

Related U.S. Application Data

(63) Continuation of application No. PCT/JP2006/318918, filed on Sep. 25, 2006.

(30) Foreign Application Priority Data

Nov. 30, 2005  (JP) .................................. 2005-345042

(51) Int. Cl.
 *C30B 11/00*   (2006.01)
(52) U.S. Cl. ............... 117/81; 117/82; 117/83; 117/931

(58) Field of Classification Search ..................... 117/81, 117/82, 83, 931
See application file for complete search history.

(56) References Cited

U.S. PATENT DOCUMENTS 3,759,310 A * 9/1973 Barrow et al. ................ 164/495
2004/0061063 A1 * 4/2004 Sherohman et al. ..... 250/370.12

* cited by examiner

*Primary Examiner* — Bob M Kunemund
(74) *Attorney, Agent, or Firm* — Hayes Soloway P.C.

(57) ABSTRACT

A high-quality polycrystalline bulk semiconductor having a large crystal grain size is produced by the casting method in which growth is regulated so as to proceed in the same plane direction, i.e., the {110}; plane or {112} plane is disclosed. The process, which is for producing a polycrystalline bulk semiconductor, comprises: a step in which a melt of a semiconductor selected among Si, Ge, and SiGe is held in a crucible; a step in which a bottom part of the crucible is cooled to give a temperature gradient and that part of the melt which is located directly on the crucible bottom is rapidly cooled in the beginning of growth to supercool the melt around the crucible bottom; a step in which the crucible is cooled to grow nuclei on the crucible bottom due to the supercooled state of the melt around the crucible bottom and thereby grow dendritic crystals along the crucible bottom; and a step in which a polycrystalline bulk of the semiconductor is then grown on the upper side of the dendritic crystals.

20 Claims, 11 Drawing Sheets

(PRESENT INVENTION)
STRUCTURALLY CONTROLLED POLYCRYSTALLINE
BULK Si (COMPARATIVE EXAMPLE)
STRUCTURALLY CONTROLLED
POLYCRYSTALLINE BULK Si 10 mm 10 mm

A (111) PLANE, WHICH IS THE MOST STABLE PLANE OF Si

DENDRITES EXTEND UPWARD OR DO NOT GROWN, THEREFORE ALIGN WITH A (111) PLANE

PLANE ORIENTATION (112) OR (100)

DENDRITES EXTEND ALONG THE BOTTOM SURFACE OF CRUCIBLE, AND THE ORIENTATION OF THE UPPER SURFACE IS THEREFORE (112) OR (110)

FIG. 11

PROCESS FOR PRODUCING POLYCRYSTALLINE BULK SEMICONDUCTOR

CROSS REFERENCE TO RELATED APPLICATION

This application is a continuation of PCT/JP2006/318918, filed Sep. 25, 2006, which was published in English and designated the U.S., and claims priority to JP Application No. 2005-345042, filed on Nov. 30, 2005, each of which are incorporated herein by reference.

BACKGROUND

1. Field

The present field relates to a process for producing a polycrystalline bulk semiconductor, and particularly relates to a process for producing polycrystalline bulk Si, Ge, or SiGe.

2. Description of the Related Technology

The casting method is known as a leading process for growing bulk crystals used in low-cost practical solar batteries. The casting method is used to produce a polycrystalline material by nuclei growth from the periphery of a cast, and to mainly grow ingots composed of polycrystalline bulk Si.

An advantage of the casting method is that large quantities of polycrystalline bulk Si can be grown relatively easily at low cost. However, the conventional casting method has a problem in that bulk crystals with good crystal quality are difficult to obtain. For example, when polycrystalline silicon thus obtained is used as a wafer of a solar battery, positive holes and charges generated by photons recombine and conversion inefficiency is reduced when a large amount of grain boundaries or the like is present in the polycrystals due to the fact that the particle size of the bulk polycrystals is small. Since the orientation of the crystal grains is not aligned in the manner of a single crystal, a textured structure cannot be formed, and conversion efficiency is reduced due to surface reflection, when the surface is chemically etched.

For this reason, it is important to improve the quality of the silicon ingot, which is the raw material of the wafer. When polycrystalline silicon is produced using the casting method, a technique is commonly used in which cooling is carried out from the bottom portion of the crucible, and crystal growth is accelerated toward the upper portions by controlling the temperature in the vertical direction. However, even when polycrystalline silicon is solidified in a single direction by using such temperature control, crystals grow from a large amount of growth nuclei in the bottom portion of the crucible. The result is that because the crystal grains are large and have nonuniform dimensions, the grain sizes are nonuniform, a large number of grain boundaries and the like is formed, and good polycrystalline silicon cannot be obtained.

To improve crystallinity in the casting method, it has been proposed that seed crystals be disposed on the bottom portion of the crucible that holds molten silicon, and good-quality single crystals or bulk polycrystals be obtained by growing crystals from the seed crystals. However, even if a technique is used in which seed crystals are disposed over the entire surface of the bottom portion of the crucible, the technique is still disadvantageous in terms of controllability and cost, residual strain increases because the growth of crystal grains is naturally inhibited, and other unwanted effects occur, making it impossible to achieve a result in which starting materials melted inside the crucible can grow while retaining the good crystallinity of the seed crystals.

It has also been proposed that solidification and growth be accelerated by generating dendrites in the initial stage of solidification of the casting method in order to improve crystallinity (see Patent Document 1).

Dendrites are dendritic crystals and the crystals are observed to be dendritic because the growth velocity in a specific direction of the crystal is rapid. Conventionally, dendrites are not observed to grow along the bottom surface of the crucible during the crystal growth of silicon.

Patent document 1 describes growing dendrites in the initial stage of solidification, and the orientation in the growth direction to be a $\{111\}$ plane. However, a $\{111\}$ plane is a stable growth plane of polycrystalline silicon, and is a plane that is naturally manifest in ordinary casting methods without the use of dendrite crystals. Therefore, one of skill in the art understands that the process disclosed in Patent Document 1 is no different in any manner from an ordinary casting method. In fact, the plane that appears is only a $\{112\}$ plane or a $\{110\}$ plane in the case that dendrite crystals are grown along the bottom surface of a crucible and it is essentially impossible to align the orientation of the crystal grains in a $\{111\}$ plane using dendrite crystals (see diagram on the left in FIG. 11). Specifically, one of skill in the art generally understands that all crystal grain orientations in a $\{111\}$ plane cannot be aligned by casting, no matter what technique is used.

In other words, only the natural orientation ratio (ordinarily 50% to 60%) can be achieved in a $\{111\}$ plane, and this is a result that has already been achieved by ordinary methods.

The process disclosed in Patent Document 1 is not a process that is designed to control the growth of dendrites in a perpendicular direction (the direction along the bottom surface) with respect to the direction of growth of the bulk crystal. Therefore, it is difficult to match the crystal grain size and the crystal grain direction in the growth direction.

Patent Document 1. Japanese Laid-open Patent Application No. 2005-132671

SUMMARY OF CERTAIN INVENTIVE ASPECTS

The most significant issue of polycrystalline silicon bulk grown using the casting method is that the crystal grain orientation in the axial direction of the growth of many ingots is random and cannot be controlled. Accordingly, a large number of crystal boundaries having poor crystallinity is present because a good textured structure cannot be formed on the surface of the crystals by chemical etching in the manner of a solar battery composed of a single bulk crystal, because the size of the crystal grains cannot be controlled, and because a bulk crystal having a large crystal grain size cannot be formed.

In relation to textured structure, it is ideal that the orientation of the surface be aligned to a $\{100\}$ plane in order to obtain a good surface textured structure by chemical etching, but a good textured structure can still be obtained even in a $\{112\}$ plane or a $\{110\}$ plane because of developments in the art of chemical etching.

With the casting method, art does not exist that allows crystal grains to be made large in controlled manner. Therefore, there is a problem in that the crystal grain size is not controlled in any manner, the crystal grain size ordinarily remains small even if crystal grains with a large size are occasionally included, and only poor-quality bulk crystals containing a large amount of crystal boundaries can be obtained.

Therefore, the present embodiment was conceived in order to eliminate the drawbacks of the prior art described above, and an object thereof is to produce a high-quality bulk crystal that has a large crystal grain size by constant control, and in which the orientation is aligned with a {112} plane or a {110} plane using dendrite crystals grown along the bottom surface of a crucible by the casting method.

The benefits of the present embodiment include growth of dendrite crystals having a growth orientation controlled along a bottom surface of a crucible in an initial stage of growth, and to subsequently grow a bulk polycrystal on a top surface having a surface orientation in which the dendrite crystals are controlled, in a process in which bulk polycrystals are grown from a melt by using a crucible.

The details of the means for solving the problems are as follows.

(1) A process for producing a polycrystalline bulk semiconductor, characterized in that a principal element constituting the bulk polycrystal is Si.

(2) The process for producing a polycrystalline bulk semiconductor, characterized in that the growth orientation of the dendritic crystals is regulated so as to proceed along a <112> direction or a <110> direction, whereby an upper surface of the dendritic crystals is limited to a {110} plane or a {112} plane.

(3) The process for producing a polycrystalline bulk semiconductor, characterized in that the angle formed by the surface of the dendritic crystals is 10° or less with respect to the bottom surface of the crucible.

(4) The process for producing a polycrystalline bulk semiconductor, characterized in that the bottom surface of the crucible is flat.

(5) The process for producing a polycrystalline bulk semiconductor, characterized in that the bottom surface of the crucible is provided with wedge-shaped and conical concavities and convexities, and dendrite crystals are grown along the bottom surface of the crucible having the concavities and convexities, whereby the grain orientation of the bulk is freely controlled with respect to the growth axis.

(6) A process for producing a polycrystalline bulk semiconductor, characterized in comprising a step for holding in a crucible a semiconductor melt selected from Si, Ge, and SiGe; a step for cooling a bottom surface of the crucible to impart a temperature gradient, and rapidly cooling the melt directly above the bottom surface of the crucible in an initial stage of growth to super cool the melt in a vicinity of the bottom surface of the crucible; a step for cooling the crucible to generate nuclei on the bottom surface of the crucible by the supercooling applied to the melt in the vicinity of the bottom surface of the crucible, and growing dendritic crystals along the bottom surface of the crucible; and a step for subsequently growing the polycrystalline bulk semiconductor on an upper surface of the dendritic crystals.

(7) The process for producing a polycrystalline bulk semiconductor, comprising the steps of holding in a crucible a semiconductor melt in which Si is a principal element, imparting a temperature gradient in a longitudinal direction in the melt in the crucible to cool the crucible, and growing the polycrystalline bulk semiconductor in a single direction on the upper surface of the dendritic crystals.

(8) A process for producing a polycrystalline bulk semiconductor, comprising a step for holding in a crucible a semiconductor melt in which Si is a principal element, rapidly cooling the melt directly above a bottom surface of the crucible in an initial stage to control the extent of supercooling of the melt in a vicinity of the bottom surface of the crucible, and controlling in a <112> direction or a <110> direction the orientation of dendritic crystals that grow along the bottom surface of the crucible due to supercooling; a step for controlling an upper surface of the dendritic crystals in a {110} plane or a {112} plane by controlling the growth direction; and a step for subsequently solidifying and growing in a single direction the polycrystalline bulk semiconductor on the upper surface of the dendritic crystals.

(9) The process for producing a polycrystalline bulk semiconductor, characterized in that the temperature gradient of the bottom surface of the crucible is controlled within a range of 10° C./cm to 150° C./cm, supercooling is applied to the melt in the vicinity of the bottom surface of the crucible, and the crucible is cooled in a range of 5° C./min to 100° C./min in the initial stage of growth to grow dendritic crystals along the bottom surface of the crucible.

(10) The process for producing a polycrystalline bulk semiconductor, characterized in that the crucible is moved through the temperature gradient toward low temperatures in a range of 0.5 mm/min to 10 mm/min in the initial stage of growth, supercooling is applied to a melt in the vicinity of the bottom surface of the crucible, and dendritic crystals are grown along the bottom surface of the crucible.

(11) The process for producing a polycrystalline bulk semiconductor, characterized in controlling the temperature gradient in the melt in the vicinity of the bottom surface of the crucible in the initial stage of growth, and growing dendritic crystals only along the bottom surface of the crucible by holding and controlling the melt temperature to 5° C. or less than the melting point within 10 mm in the upward direction from the bottom surface of the crucible.

(12) The process for producing polycrystalline bulk semiconductor, characterized in controlling the temperature gradient of the entire crucible containing the melt in a range of 10° C./cm to 100° C./cm, and controlling the cooling velocity in two stages in which the crucible is cooled in the initial stage of growth in a range of 5° C./min to 100° C./min to grow dendritic crystals along the bottom surface of the crucible in the temperature gradient, and is subsequently cooled at 0.4° C./min to 5° C./min to grow bulk polycrystal on the upper surface of the dendritic crystals.

(13) The process for producing polycrystalline bulk semiconductor, characterized in forcibly cooling the bottom surface of the crucible and allowing heat to escape only from the bottom surface of the crucible by placing a cooling tube on the bottom surface of the crucible in order to control the temperature of the bottom surface of the crucible in the initial stage of growth.

(14) The process for producing polycrystalline bulk semiconductor, characterized in that a material of the crucible that contains the melt for growing a bulk polycrystal is quartz.

In accordance with the preferred embodiment, high quality polycrystalline bulk semiconductor can be produced by growing dendritic crystals over the entire bottom surface of the crucible in the initial stage of solidification.

The polycrystalline bulk semiconductor obtained by using the present embodiment achieves the following effects because the crystal orientations of the crystal grains are aligned and the crystal grain size can be made to be very large.

(1) The crystal quality is uniform and high, and the conversion efficiency in a solar battery application is high.

(2) Variability in performance can be reduced based on the position in which a wafer is cut from the cast.

(3) The yield in the usable ingot area is increased by two times or more because the quality is uniform from the bottom surface to the upper surface of the grown ingot. This is very effective in reducing costs.

(4) A good textured structure can be formed on the surface of the crystals by chemical etching in the manner of a solar battery composed of a single bulk crystal.

Figure 11:
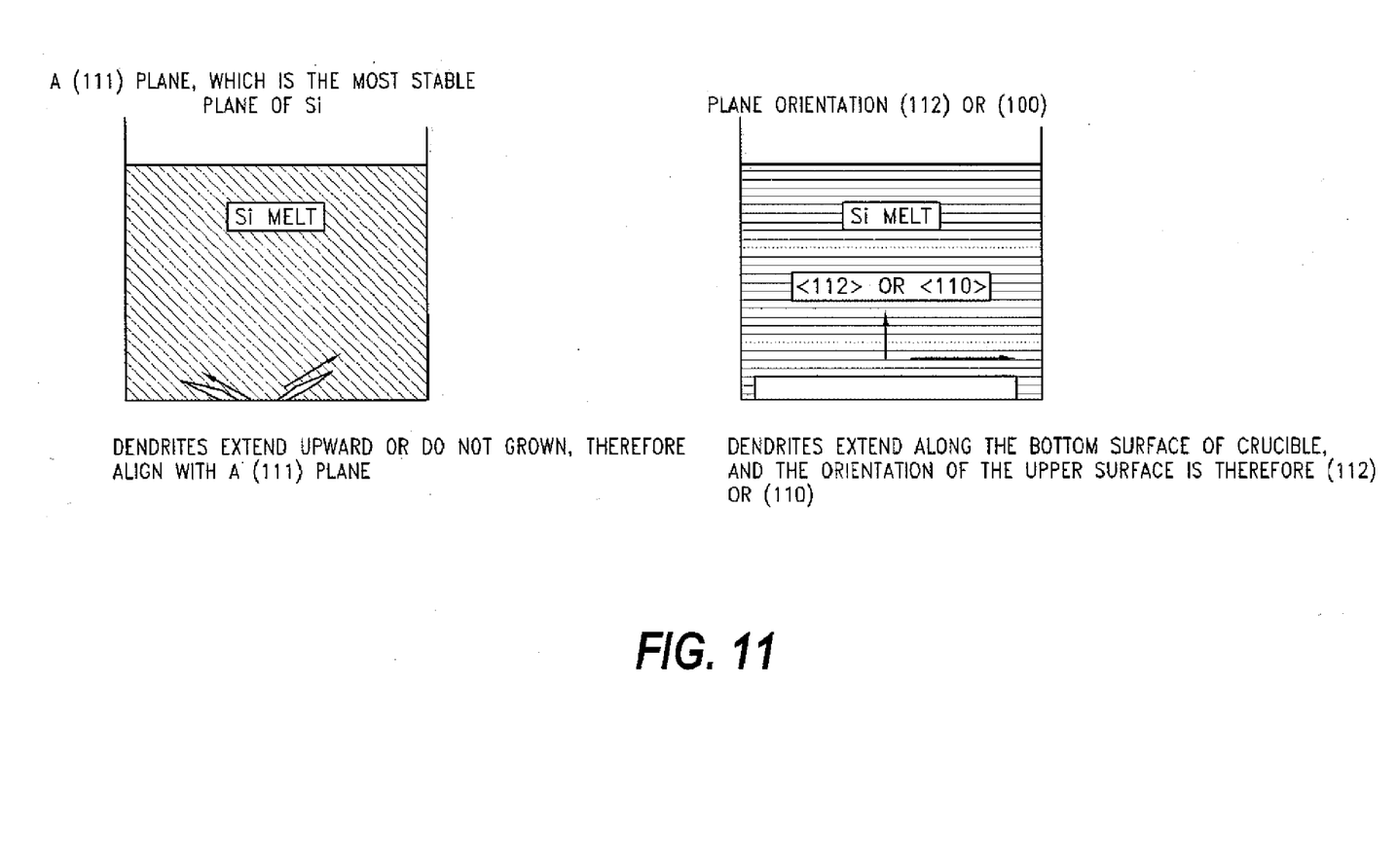
FIG. 11 is a diagram showing a comparison of the production process of the present embodiment and that of Patent Document 1.

For reference, the process for producing a polycrystalline bulk semiconductor according to the present embodiment (right diagram) and the process for producing a polycrystalline bulk semiconductor disclosed in Patent Document 1, as defined above (left diagram), are contrasted in FIG. 11. In the left diagram, the dendritic crystals extend upward, but since the growth is not dendritic, the effect of controlling the crystal grain orientation and controlling the crystal grain size by using dendritic crystals is completely nonexistent, and since the crystals grow by natural growth mechanisms, a $\{111\}$ plane appears as the most stable plane for Si. In contrast, in the present embodiment, dendritic crystals extend along the bottom surface of the crucible and the crystal grain orientation of the upper surface can accordingly be aligned with a $\{110\}$ plane or a $\{112\}$ plane, the crystal grain size can be increased to 3 cm or more, a textured structure can be produced in a bulk polycrystal, and it is possible to obtain a bulk polycrystal that has very high quality, considerable lifetime, and few crystal boundaries.

DETAILED DESCRIPTION OF CERTAIN INVENTIVE EMBODIMENTS

Certain embodiments provide a casting method, which is the main technique for producing crystals for highly efficient solar batteries, and an object is to provide a high-quality polycrystalline bulk semiconductor in which the orientation of the crystal growth is aligned and the crystal grains are made large in controlled manner. Embodiments are described below with reference to the diagrams.

First, the conditions in which dendrite growth occurs were confirmed in order to obtain a good-quality polycrystalline bulk semiconductor achieved in the present embodiment. Behavior of a melt during crystallization was observed using an observation device (see J. of Crystal Growth 262 (2004) 124-129) developed by the present inventors for observing the melt growth process.

Starting material Si held in a quartz crucible was completely melted at 1450° C. and cooled at 30° C./min. The manner in which dendritic crystals grew along the bottom surface of a crucible was observed, and dendritic crystals were seen to grow along the bottom surface of a crucible by the rapid cooling of the melt (left diagram in FIG. 1).

Figure 1:
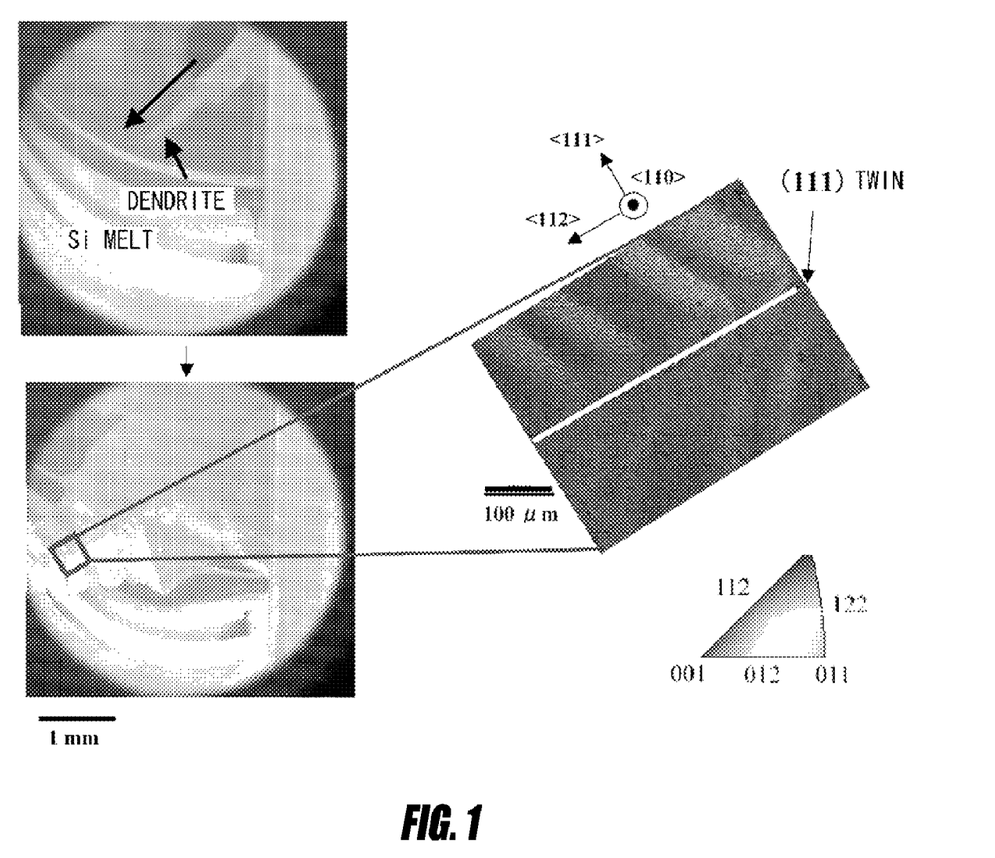
FIG. 1 is a diagram showing the state of dendritic crystals grown along the bottom surface of a crucible, and the analysis results of the orientation of dendritic crystals.

After crystallization, the orientation of the dendritic crystals was analyzed, and it was apparent that the direction in which the dendritic crystals extended along the bottom surface of the crucible was a <112> direction or a <110> direction that is orthogonal thereto, and the upper surface of the dendrites had an orientation of <110> or <112> (right diagram in FIG. 1).

A $\{111\}$ twin plane was always introduced in the direction perpendicular to the upper surface of the dendrites in the center portion of the dendrites that grow along the bottom surface of a crucible in this manner, the upper surface of the dendrites was always a $\{110\}$ plane or a $\{112\}$ plane, and the upper surface of the dendrites never physically became a $\{111\}$ plane.

Such dendritic crystals were observed to grow in a state in which supercooling of 5° C. or more was applied to the melt, and the thickness of the dendritic crystals was about 2 to 5 mm. In other words, in the casting method, it was shown that the melt temperature within 10 mm in the upward direction from the bottom surface of the crucible must be controlled to be 5° C. or less so that dendritic growth is manifest along the bottom surface of a crucible in the initial growth process.

Figure 2:
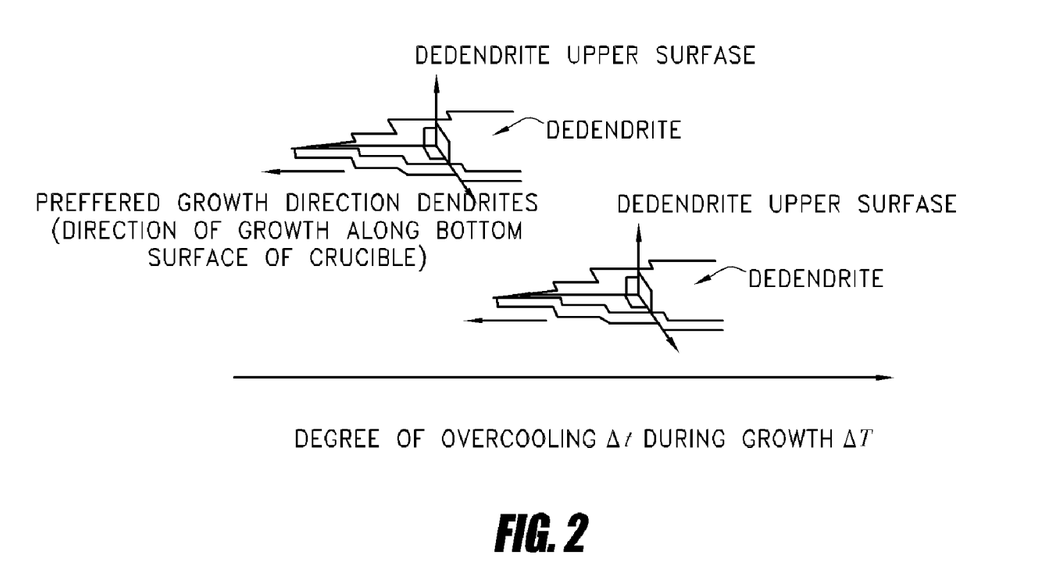
FIG. 2 is a diagram showing the orientation relationship of the dendritic crystals grown along the bottom surface of a crucible.

FIG. 2 schematically shows the orientation relationship of dendritic crystals grown along the bottom surface of a crucible in the initial stage of growth. When the orientation of the dendritic growth is <112>, the upper surface is in the <110> direction, and when the orientation of the growth is <110>, the upper surface is in the <112> direction. In either case, a $\{111\}$ plane is a crystal plane in the growth direction of the dendrites and is orthogonal to the upper surface of the dendrites.

The dendritic growth was found to occur in conditions in which only the melt in the vicinity of the bottom surface of the crucible is rapidly cooled and in which a state is created so that supercooling is performed along the bottom surface of the crucible. In the experiment, rapid cooling was carried out at about 30° C./min, and a tendency was seen in which the preferred growth direction more often a <110> direction rather than a <112> direction when the rate of supercooling was increased. However, dendritic growth did not occur in any other direction.

The reason that dendritic crystals were not observed in silicon and other semiconductor materials until now is that the growth velocity when the single crystal silicon is lifted or when the polycrystalline ingot is grown was a very low rate of about 1 nm/min or less, and it is surmised that these were not conditions for dendritic growth.

EXAMPLES

Figure 3:
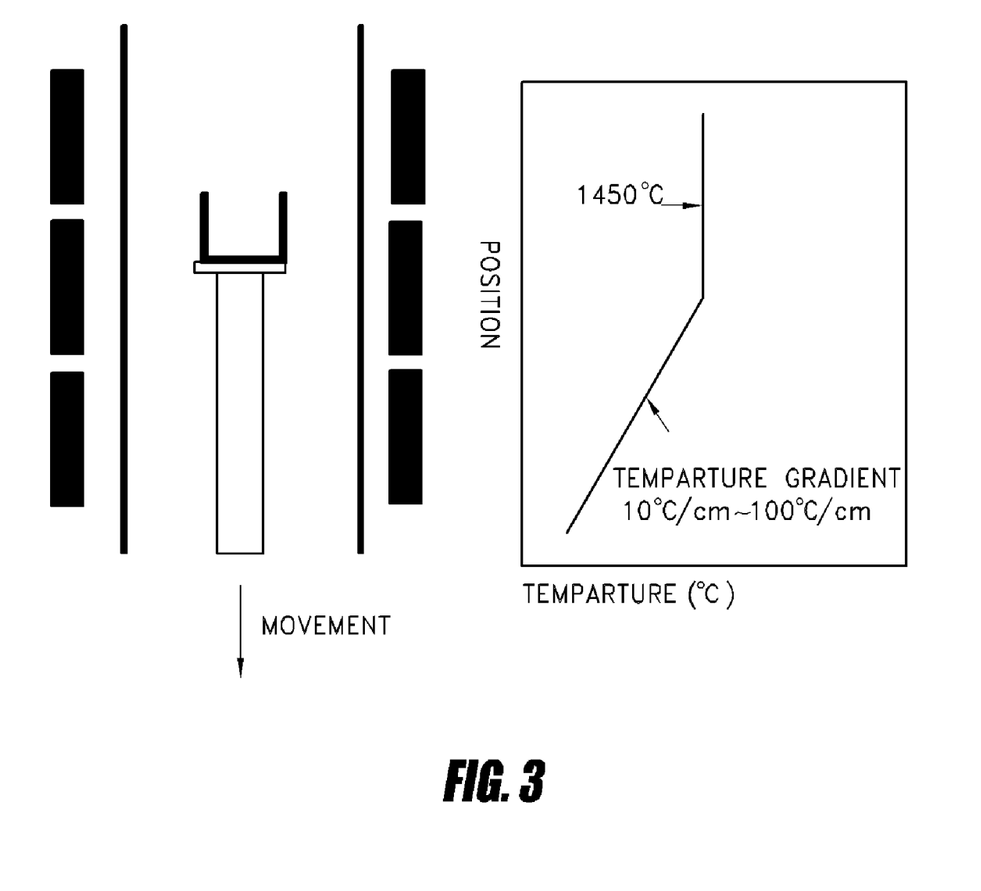
FIG. 3 is diagram showing the arrangement of a crucible and the temperature distribution inside a furnace.
Figure 4:
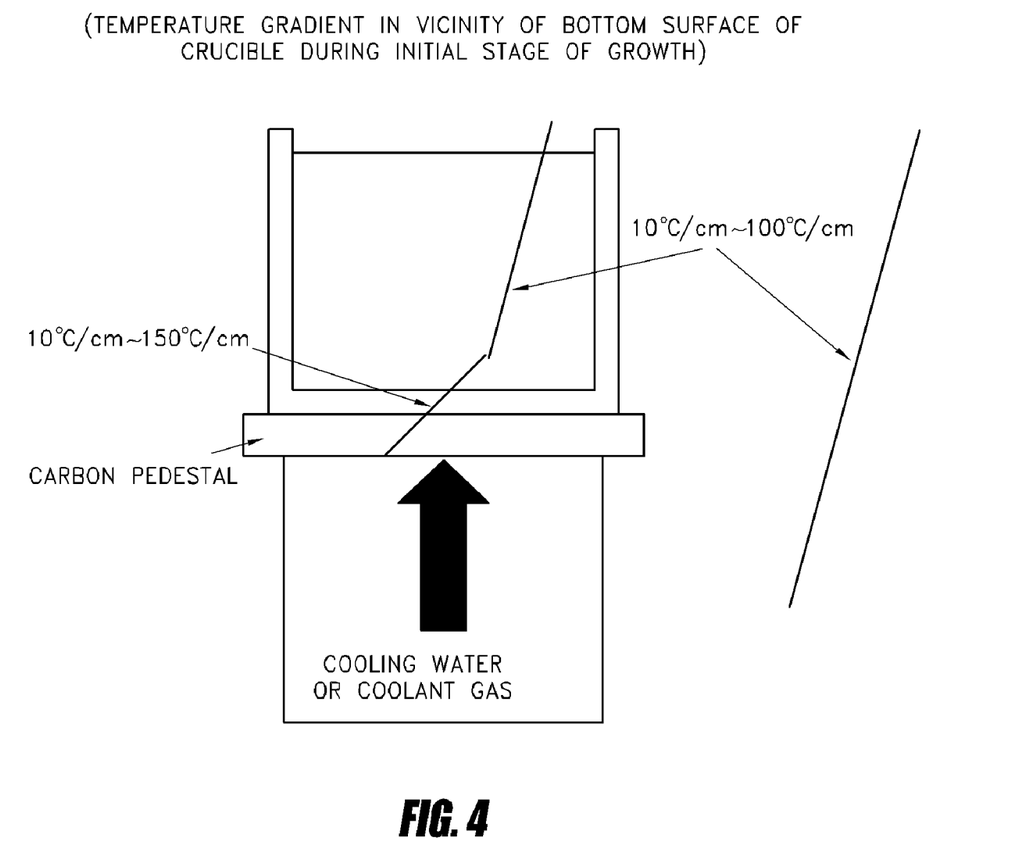
FIG. 4 is a diagram showing the temperature gradient in the vicinity of the bottom surface of a crucible in the initial stage of growth.

Casting was carried out based on these findings by using a silicon material. About 100 g of Si starting material was placed in a quartz crucible having an inside diameter of 50 mm, the temperature was increased to 1450° C., and the material was completely melted in an Ar atmosphere to produce an Si melt. The crucible was placed on a platform made of carbon, and heat was removed from the platform. Next, the crucible containing the melt was moved under the temperature gradient shown in FIG. 3. The temperature gradient was implemented from 10° C./cm to 100° C./cm as shown in the right diagram of FIG. 3. It is also possible to bring a cooling tube into which cooling water or a coolant gas has been introduced close to the bottom surface of the crucible from below the crucible in the initial stages of the growth process. Heat was removed from the carbon platform, or a cooling tube was introduced, whereby a temperature gradient of 10° C./cm to 150° C./min was locally applied in the vicinity of the bottom surface of the crucible (see FIG. 4).

Next, in the case that the temperature gradient is set to about 20° C./cm, for example, the crucible is moved at about 5 mm/min until the bottom surface of the crucible reaches the 1390° C. position, which is 24° C. lower than 1414° C., the melting point of Si. The cooling velocity of the bottom surface of the crucible can be determined from the temperature gradient and movement velocity to be about 10° C./min. The cooling velocity is not necessarily directly equal to the growth velocity of the crystals, but it can be possible to produce a state of supercooling that is sufficient to grow dendritic crystals.

The cooling velocity in this case is determined by the temperature gradient and the movement velocity. Numerous experiments show that dendritic crystals grow when the cooling velocity of the bottom surface of the crucible is about 5° C./min to about 100° C./min at a crucible movement velocity of about 0.5 mm/min to about 10 mm/min.

Figure 5:
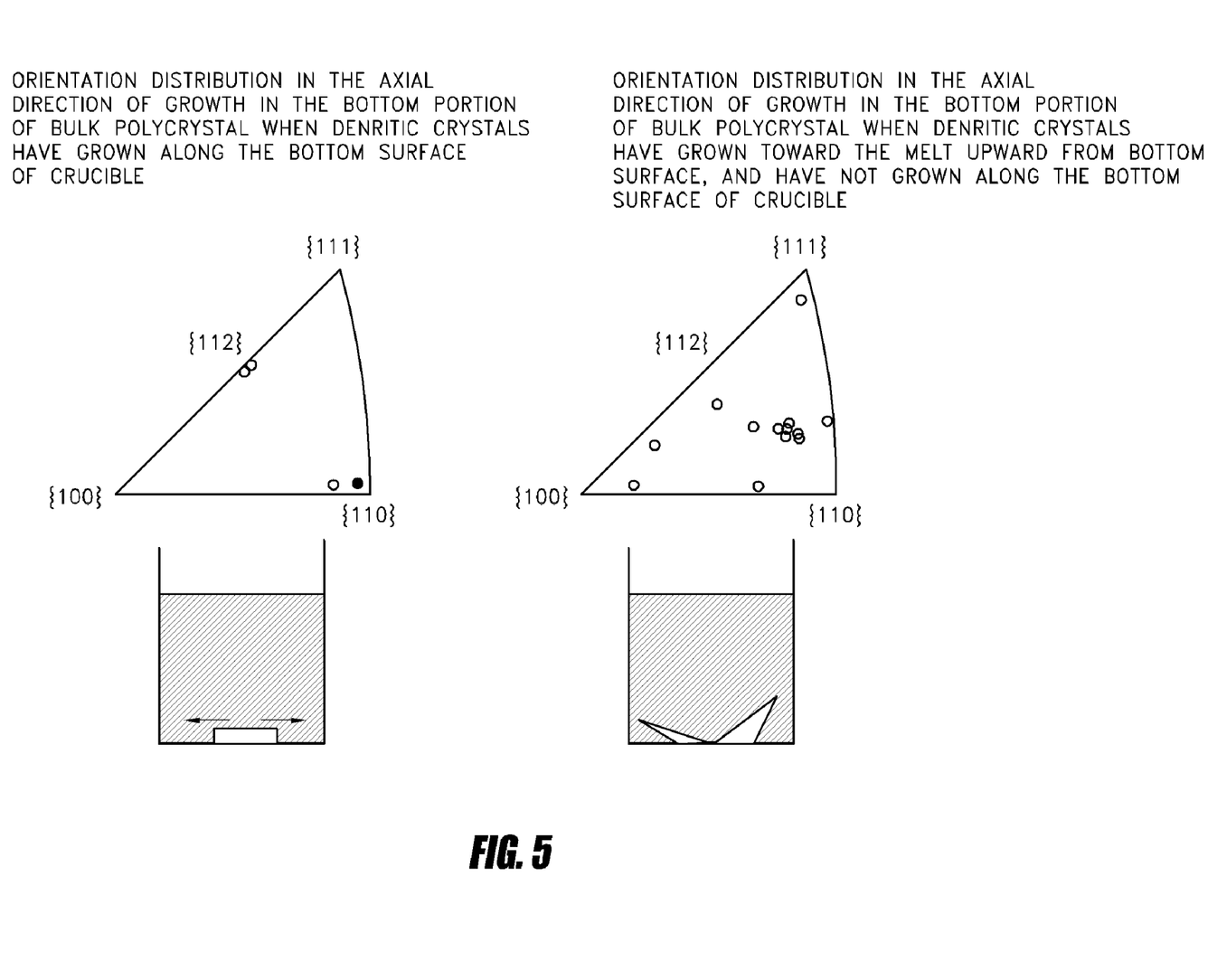
FIG. 5 is a diagram showing a bulk polycrystal in which dendritic crystals have grown along the bottom surface of a crucible, and the orientation distribution of a bulk polycrystal bulk in which dendritic crystals have not grown along the bottom surface of a crucible.

When dendritic crystals grow along the bottom surface of the crucible at an angle of about 10° or less between the dendritic crystal plane and the bottom surface of the crucible, the orientation of the axial direction of growth is controlled to be a {112} plane or a {110} plane (left diagram of FIG. 5).

However, even if the dendritic crystals grow on the bottom surface of the crucible, the orientation of the axial direction of growth can no longer be controlled when growth takes place toward the melt side in the upward direction from the bottom surface (right diagram of FIG. 5).

In this manner, the axial direction of growth can be controlled to be a {112} plane or a {110} plane when the shape of the bottom surface of the crucible is flat and the dendritic crystals grow along the bottom surface of the crucible.

When the orientation is to be aligned in another plane, the orientation of the axial direction of growth can be freely controlled by forming wedge shapes or conical shapes in the bottom surface of the crucible and growing dendritic crystals along the bottom surface of a crucible.

The temperature that is below the melting temperature is about 1390° C. in the examples, but dendritic crystals were also found to grow when the temperature was reduced approximately 5° C. below the melting point (1409° C. in the case of silicon).

Immediately below the melting point, the growth of dendritic crystals and the state of the melt of the crystals is balanced. Therefore, time is required to growth dendritic crystals over the entire bottom surface as required. Conversely, when the temperature of the bottom surface is reduced to an even lower temperature, the temperature of the entire melt is reduced, unintended crystal growth starts from the side surfaces, and undesirable growth of the dendritic crystals occurs toward the center of the melt. In other words, a temperature that is 30° C. or less than the melting point may not be suitable for carrying out the present embodiment.

Here, cooling is performed in the present example using means in which a crucible is moved through a temperature gradient; however the present embodiment can also be implemented using a cooling method or temperature control method that is suitable for implementing the present embodiment. For example, the same effect can be demonstrated by controlling the temperature of a peripheral heating element without moving the crucible. Also, water or another medium may be brought into close proximity or into contact to cool the lower portion of the crucible.

Dendritic crystals are grown by supercooling to the melting temperature or lower using the means described above. Dendritic crystals can be grown over the entire bottom surface by adequately maintaining this state. The time required is determined by the temperature at which the bottom surface is held, the temperature of the melt, and the temperature gradient. In the present example, dendritic crystals were shown to grow along the bottom surface of a crucible with a holding time of about 40 minutes. When dendritic crystals cover the entire bottom surface and are held in this state, the temperature of the melt can be fairly high. Accordingly, further crystal growth does not occur and a state of equilibrium is reached. Therefore, there is no limitation that the holding time be long.

The crucible is subsequently moved downward at about 0.2 mm/min, and the entire melt is allowed to crystallize. The movement velocity is about 0.4° C./min in terms of cooling velocity, and the same can apply when silicon crystals are grown using an ordinary casting method. The upper limit of the cooling velocity is about 5° C./min.

In relation to the growth of dendritic crystals, a novel temperature control may be required in that growth takes place over the entire bottom surface, but the techniques of the conventional casting method can be directly applied to crystallize the entire melt.

Figure 6:
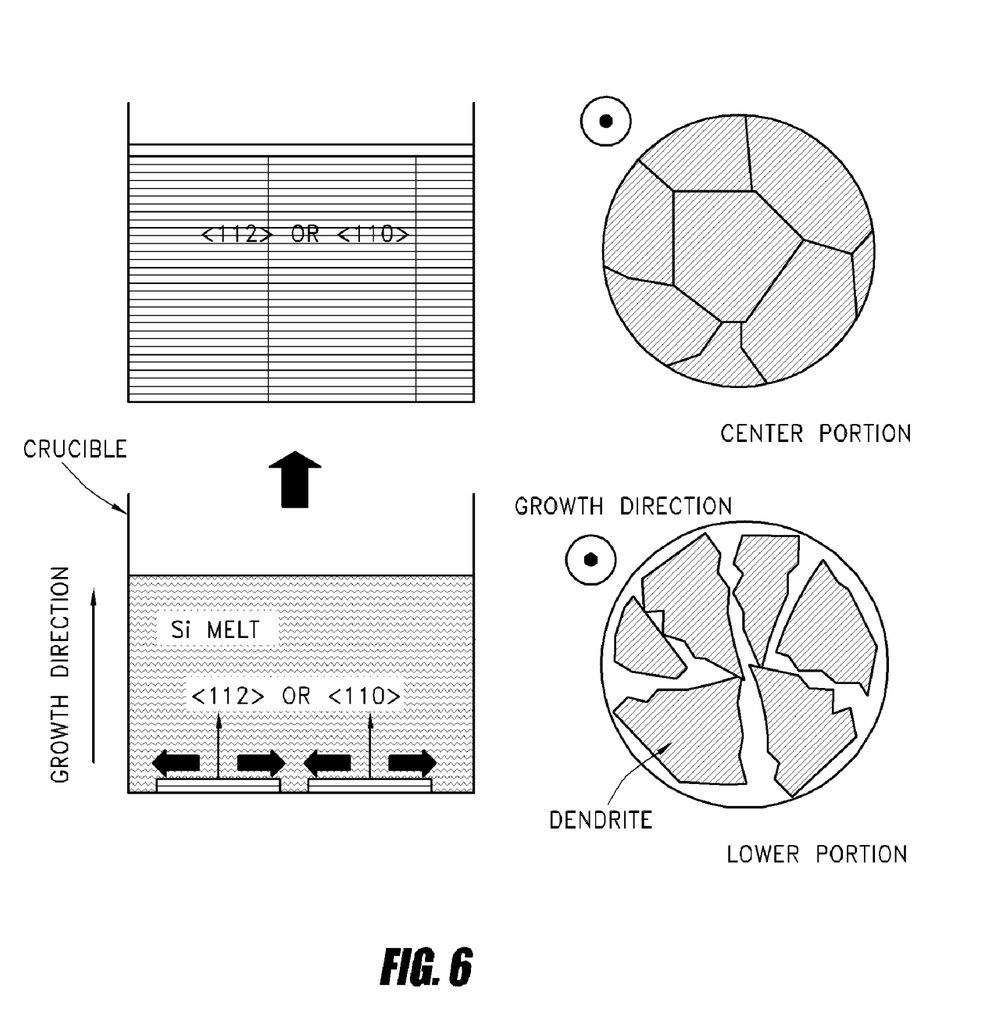
FIG. 6 is an image of crystal growth for obtaining a polycrystalline bulk semiconductor in which the orientation has been aligned.

FIG. 6 shows an image of crystal growth for obtaining the orientationally aligned polycrystalline bulk semiconductor of the present embodiment. Dendrites (crystals that have a plane in a <112> direction or in a <110> direction) that grow in special conditions in the bottom portion of a crucible can be grown over the entire bottom portion, and the entire melt can then be formed into an ingot having good crystallinity while maintaining the crystallinity of the dendrites.

An orientation analysis was carried out using the EBSP method, which is a method that entails cutting, polishing, and observing the crystal orientation in order to study the characteristics of the resulting polycrystalline bulk semiconductor. Bulk polycrystal was obtained having crystal grains in which growth was aligned in a <112> direction (left diagram of FIG. 7).

Figure 7:
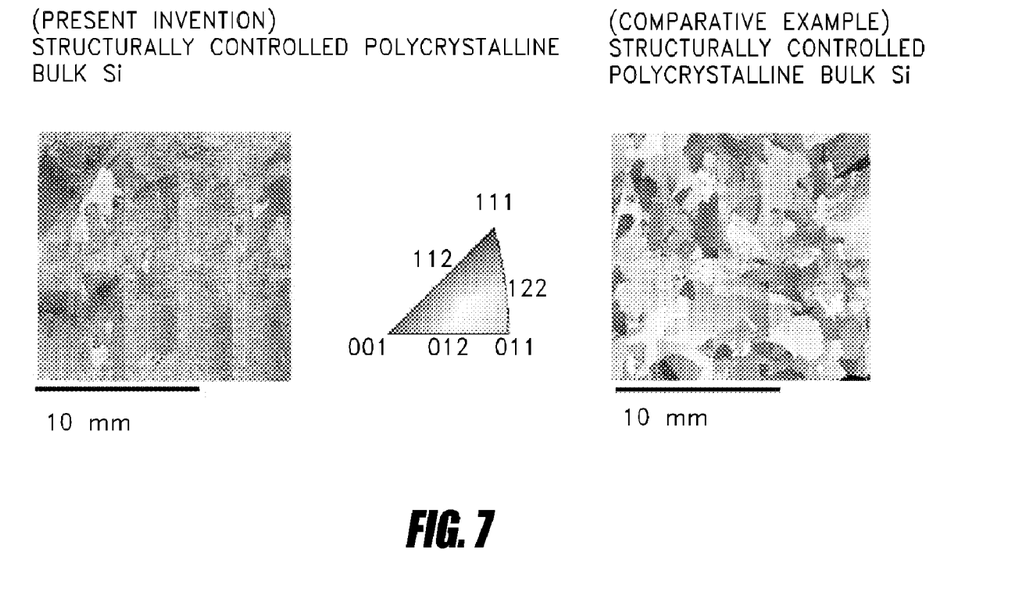
FIG. 7 is a diagram showing the analysis results of the orientation of the growth direction of polycrystalline bulk Si in which orientation has been controlled using dendritic growth along the bottom surface of a crucible in the initial stage of growth (left) and polycrystalline bulk Si (right) in which orientation has not be controlled.

The result of analyzing the orientation of a polycrystalline bulk semiconductor produced without generating dendritic crystals is shown for comparison (right diagram of FIG. 7).

It is apparent from FIG. 7 as well that an orientationally aligned polycrystalline bulk Si can be obtained by growing dendritic crystals along the bottom surface of a crucible in the initial stage of growth.

Figure 8:
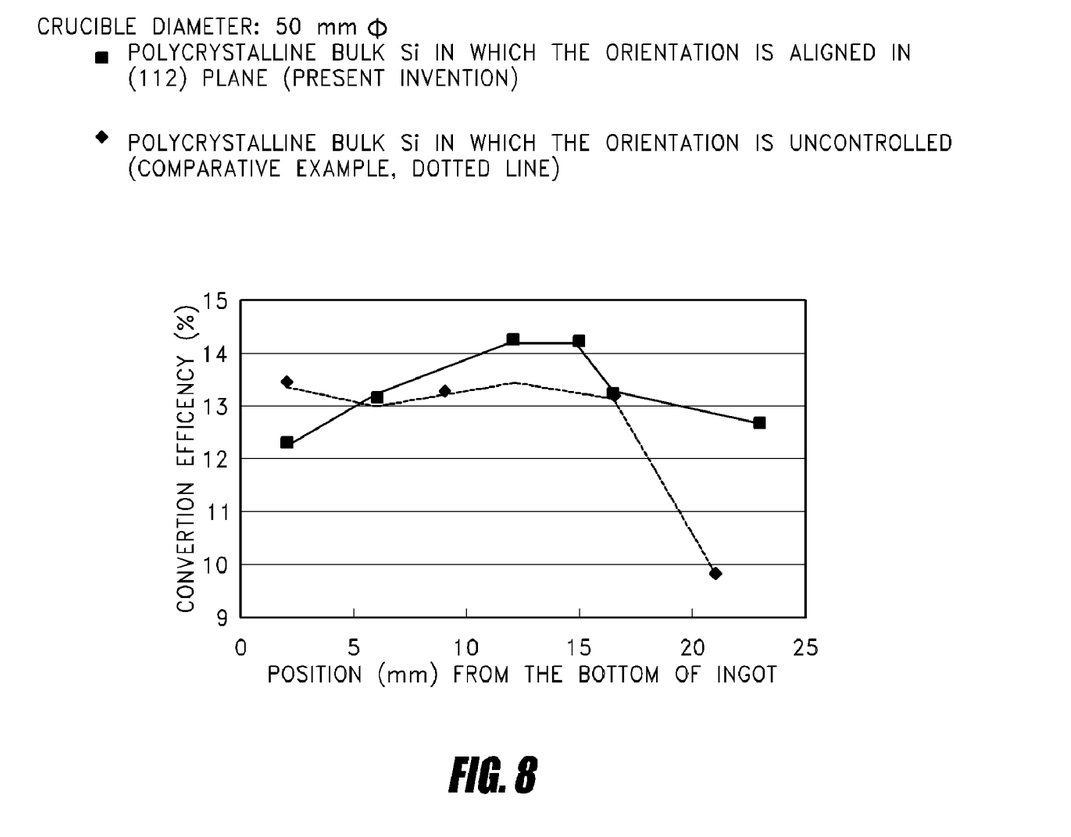
FIG. 8 is a diagram showing a comparison of the solar battery characteristics of polycrystalline bulk Si grown without controlling orientation and polycrystalline bulk Si in which orientation has been controlled using dendritic growth along the bottom surface of a crucible in the initial stage of growth.

FIG. 8 is a diagram showing a comparison of the solar battery characteristics of polycrystalline bulk Si grown without controlling orientation and polycrystalline bulk Si in which orientation has been controlled using dendritic growth along the bottom surface of a crucible in the initial stage of growth. As shown in the diagram, the conversion efficiency of a solar battery produced by cutting away the resulting crystals is high and uniform across substantially the entire bulk polycrystal. The height of the resulting ingot was about 25 mm, and it was therefore surmised that the ingot could be used as an effective material for solar batteries from the bottom surface of the ingot to the upper portions. As a comparative example, polycrystalline bulk Si was grown without controlling the orientation using the same crucible and the same Si material under ordinary cooling methods, and observation was carried out in the same manner. The conversion efficiency was considerably reduced in the upper portion of the ingot.

Silicon is used as a material in the present example, but it is apparent that similar behavior in crystal growth can be obtained by using germanium (Ge) or silicon-germanium (SiGe).

Figure 9:
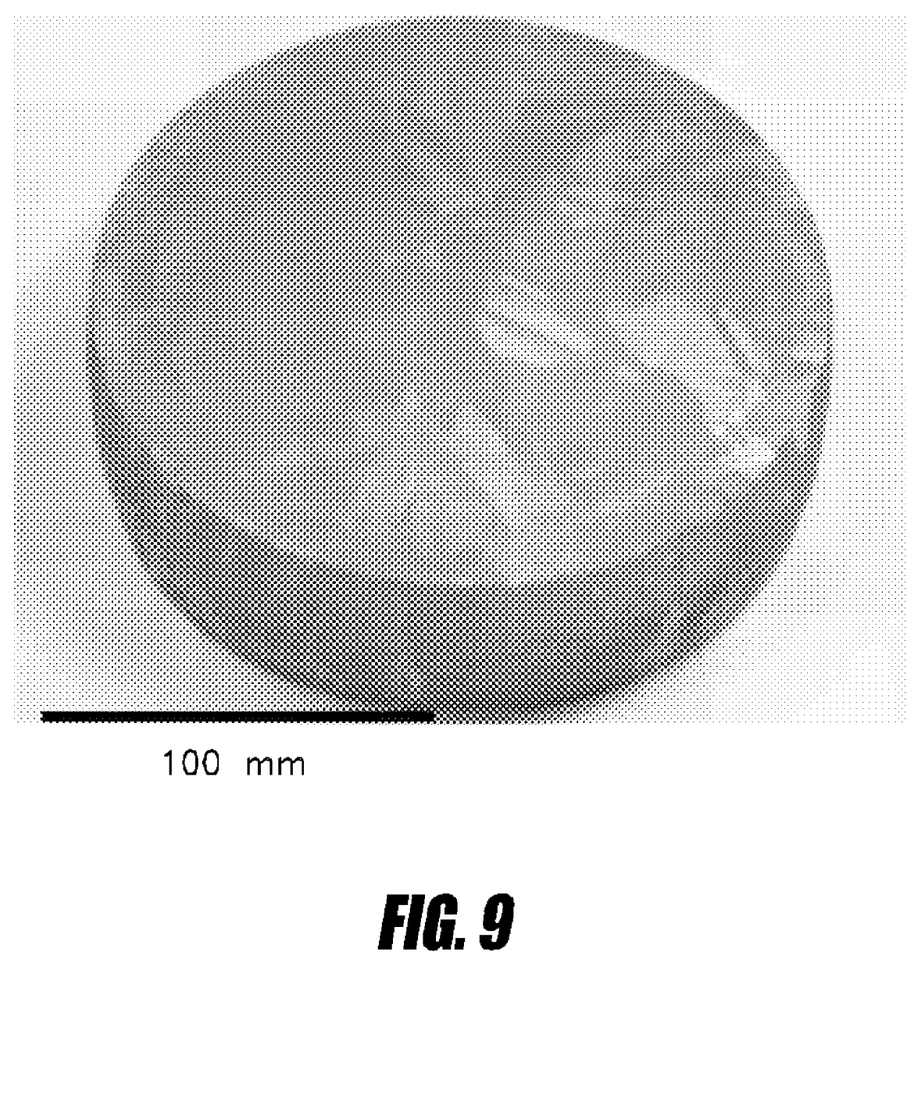
FIG. 9 is a photograph of a cross section of polycrystalline bulk Si produced by the present embodiment using a crucible having a diameter of 150 mm.

Next, in terms of practicality, crystals can be produced using a large crucible. Therefore, polycrystalline bulk Si was produced using the process of the present embodiment using crucible having diameters of about 80 mm and about 150 mm. FIG. 9 shows a photograph of a cross section of polycrystalline bulk Si produced using a crucible having a diameter of 150 mm. The crystal grain size was very large, the largest being about 60 mm. The crystal grain size can thus be made very large by growing dendritic crystals along the bottom surface of a crucible in the initial stage of growth.

Figure 10:
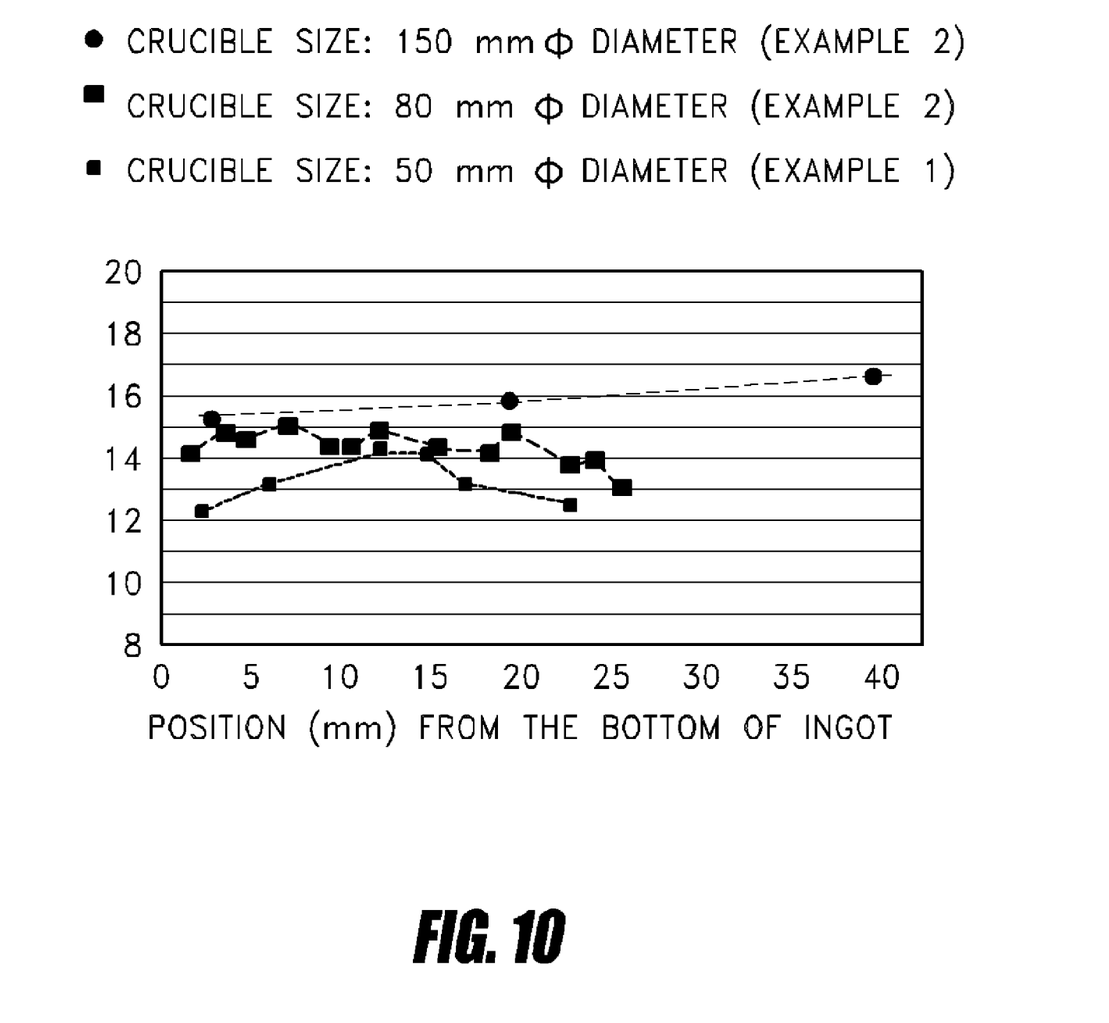
FIG. 10 is a diagram showing a comparison of the conversion efficiency of polycrystalline bulk Si produced by the present embodiment using crucibles of various sizes.

FIG. 10 is a diagram showing a comparison of the conversion efficiency of a polycrystalline bulk Si solar battery produced by the process of the present embodiment using crucibles of various sizes. It is apparent from the diagram that the characteristics of a solar battery are improved by increasing the size of the crucible.

What is claimed is:

1. A method of producing a polycrystalline bulk semiconductor wherein a bulk polycrystal is grown from a melt by using a crucible, the method comprising:
   growing dendrite crystals having a growth orientation controlled along a bottom surface of a crucible in an initial stage of growth; and
   subsequently growing a bulk polycrystal on a top surface having a surface orientation in which said dendritic crystals are controlled.

2. The method of claim 1, wherein said bulk polycrystal comprises Si.

3. The method of claim 1, wherein the growth orientation of the dendritic crystals is regulated so as to proceed along a <112> direction or a <110> direction, whereby an upper surface of the dendritic crystals is limited to a {110} plane or a {112} plane.

4. The method of claim 3, wherein the angle formed by the surface of the dendritic crystals is about 10° or less with respect to the bottom surface of the crucible.

5. The method of claim 3, wherein the bottom surface of the crucible is substantially flat.

6. The method of claim 1, wherein:
   said bottom surface of the crucible is provided with wedge-shaped and conical concavities and convexities; and
   wherein said dendrite crystals are grown along said bottom surface of the crucible having the concavities and convexities, whereby the grain orientation of the bulk polycrystal is freely controlled with respect to the growth axis.

7. A method of producing a polycrystalline bulk semiconductor, comprising:
   holding in a crucible a semiconductor melt selected from Si, Ge, and SiGe;
   cooling a bottom surface of the crucible to impart a temperature gradient, and rapidly cooling the melt directly above the bottom surface of the crucible in an initial stage of growth to super cool the melt in a vicinity of the bottom surface of the crucible;
   cooling the crucible to generate nuclei on the bottom surface of the crucible by the supercooling applied to the melt in the vicinity of the bottom surface of the crucible, and growing dendritic crystals along the bottom surface of the crucible; and
   growing the polycrystalline bulk semiconductor on an upper surface of said dendritic crystals.

8. The method of claim 7, comprising:
   holding in a crucible a semiconductor melt in which Si is a principal element;
   imparting a temperature gradient in a longitudinal direction in the melt in the crucible to cool the crucible; and
   growing the polycrystalline bulk semiconductor in a single direction on the upper surface of said dendritic crystals.

9. The method of claim 8, further comprising:
   controlling the temperature gradient of the bottom surface of the crucible within a range of about 10° C./cm to about 150° C./cm;
   applying supercooling the melt in the vicinity of the bottom surface of the crucible; and
   cooling the crucible in a range of about 5° C./min to about 100° C./min in the initial stage of growth to grow dendritic crystals along the bottom surface of the crucible.

10. The method of claim 7, further comprising:
    moving the crucible through said temperature gradient toward low temperatures in a range of about 0.5 mm/min to about 10 mm/min in the initial stage of growth;
    applying supercooling to the melt in the vicinity of the bottom surface of the crucible; and
    growing dendritic crystals along the bottom surface of the crucible.

11. The method of claim 7, further comprising:
    controlling the temperature gradient in the melt in the vicinity of the bottom surface of the crucible in said initial stage of growth; and
    growing dendritic crystals only along the bottom surface of the crucible by holding and controlling the melt temperature to about 5° C. or less than the melting point within 10 mm in the upward direction from the bottom surface of the crucible.

12. The method of claim 7, further comprising:
    controlling the temperature gradient of the entire crucible containing the melt in a range of about 10° C./cm to about 100° C./cm; and
    controlling the cooling velocity in two stages in which the crucible is cooled in the initial stage of growth in a range of about 5° C./min to about 100° C./min to grow dendritic crystals along the bottom surface of the crucible in the temperature gradient, and is subsequently cooled at about 0.4° C./min to about 5° C./min to grow a bulk polycrystal on the upper surface of the dendritic crystals.

13. The method of claim 7, further comprising forcibly cooling the bottom surface of the crucible and allowing heat to escape substantially only from the bottom surface of the crucible by placing a cooling tube on the bottom surface of the crucible in order to control the temperature of the bottom surface of the crucible in the initial stage of growth.

14. The method of claim 7, wherein a material of the crucible that contains the melt for growing a bulk polycrystal is quartz.

15. A method of producing a polycrystalline bulk semiconductor, comprising:
    holding in a crucible, a semiconductor melt in which Si is a principal element;
    rapidly cooling the melt directly above a bottom surface of the crucible in an initial stage of growth to control the extent of supercooling of the melt in a vicinity of the bottom surface of the crucible;

controlling in a <112> direction or a <110> direction the orientation of dendritic crystals that grow along the bottom surface of the crucible due to supercooling;

controlling an upper surface of the dendritic crystals in a {110} plane or a {112} plane by controlling the growth direction; and solidifying and growing in a single direction the polycrystalline bulk semiconductor on the upper surface of said dendritic crystals.

16. The method of claim 15, further comprising:

controlling the temperature gradient of the bottom surface of the crucible within arrange of about 10° C./cm to about 150° C./cm;

applying supercooling the melt in the vicinity of the bottom surface of the crucible; and cooling the crucible in a range of about 5° C./min to about 100° C./min in the initial stage of growth to grow dendritic crystals along the bottom surface of the crucible.

17. The method of claim 15, further comprising:

moving the crucible through said temperature gradient toward low temperatures in a range of about 0.5 mm/min to about 10 mm/min in the initial stage of growth;

applying supercooling to the melt in the vicinity of the bottom surface of the crucible; and growing dendritic crystals along the bottom surface of the crucible.

18. The method of claim 15, further comprising:

controlling the temperature gradient in the melt in the vicinity of the bottom surface of the crucible in said initial stage of growth; and growing dendritic crystals only along the bottom surface of the crucible by holding and controlling the melt temperature to about 5° C. or less than the melting point within about 10 mm in the upward direction from the bottom surface of the crucible.

19. The method of claim 15, further comprising:

controlling the temperature gradient of the entire crucible containing the melt in a range of about 10° C./cm to about 100° C./cm; and controlling the cooling velocity in two stages in which the crucible is cooled in the initial stage of growth in a range of about 5° C./min to about 100° C./min to grow dendritic crystals along the bottom surface of the crucible in the temperature gradient, and is subsequently cooled at about 0.4° C./min to about 5° C./min to grow a bulk polycrystal on the upper surface of the dendritic crystals.

20. The method of claim 15, further comprising forcibly cooling the bottom surface of the crucible and allowing heat to escape substantially only from the bottom surface of the crucible by placing a cooling tube on the bottom surface of the crucible in order to control the temperature of the bottom surface of the crucible in the initial stage of growth.

* * * * *